(12) United States Patent
Kikuchi

(10) Patent No.: US 10,524,319 B2
(45) Date of Patent: Dec. 31, 2019

(54) ORGANIC ELECTROLUMINESCENT LIGHT EMITTING DEVICE

(71) Applicant: KONICA MINOLTA, INC., Tokyo (JP)

(72) Inventor: Koutarou Kikuchi, Hachioji (JP)

(73) Assignee: KONICA MINOLTA, INC., Tokyo (JP)

(*) Notice: Subject to any disclaimer, the term of this patent is extended or adjusted under 35 U.S.C. 154(b) by 0 days.

(21) Appl. No.: 16/076,169

(22) PCT Filed: Sep. 1, 2016

(86) PCT No.: PCT/JP2016/075624
§ 371 (c)(1),
(2) Date: Aug. 7, 2018

(87) PCT Pub. No.: WO2017/138179
PCT Pub. Date: Aug. 17, 2017

(65) Prior Publication Data
US 2019/0150235 A1    May 16, 2019

(30) Foreign Application Priority Data

Feb. 10, 2016  (JP) .................................. 2016-023707

(51) Int. Cl.
*H01L 51/00* (2006.01)
*H05B 33/04* (2006.01)
*H01L 51/52* (2006.01)

(52) U.S. Cl.
CPC ......... *H05B 33/04* (2013.01); *H01L 51/5246* (2013.01); *H01L 51/5253* (2013.01); *H01L 51/5259* (2013.01)

(58) Field of Classification Search
None
See application file for complete search history.

(56) References Cited

U.S. PATENT DOCUMENTS

2007/0097130 A1   5/2007   Margulis
2007/0194711 A1*  8/2007   Matsuura ............ H01L 51/5246
                                                     313/512
(Continued)

FOREIGN PATENT DOCUMENTS

JP     2006244946 A    9/2006
JP     2007220593 A    8/2007
(Continued)

OTHER PUBLICATIONS

Extended European Search Report dated Dec. 3, 2018 from the corresponding European Application No. 16889880.7.
(Continued)

*Primary Examiner* — Hung K Vu
(74) *Attorney, Agent, or Firm* — Lucas & Mercanti, LLP

(57) ABSTRACT

Provided is a highly reliable organic EL light emitting device that is equipped with: an organic EL element having a first electrode, an organic EL layer, and a second electrode, which are provided on a flexible base material; a first sealing section that seals, on the flexible base material, the organic EL element; a moisture absorbent layer that is provided on the first sealing section; and a second sealing section covering the moisture absorbent layer and the first sealing section.

13 Claims, 3 Drawing Sheets

(56) References Cited

U.S. PATENT DOCUMENTS

2012/0007107 A1* 1/2012 Choi .................. H01L 51/5253
257/88
2015/0340655 A1 11/2015 Lee et al.

FOREIGN PATENT DOCUMENTS

| | | |
|---|---|---|
| JP | 2008181832 A | 8/2008 |
| JP | 2009514124 A | 4/2009 |
| JP | 2011020335 A | 2/2011 |
| JP | 5545301 B2 | 7/2014 |
| JP | 2014154507 A | 8/2014 |
| KR | 10-2007-0083213 A | 8/2007 |
| KR | 10-2012-0004864 A | 1/2012 |
| KR | 10-2012-0074063 A | 7/2012 |
| KR | 10-2015-0072116 A | 6/2015 |
| WO | 2011052630 A | 5/2011 |

OTHER PUBLICATIONS

Office Action dated Jun. 7, 2019 from the corresponding Korean Application No. 10-2018-7016795 and English translation.

* cited by examiner

ORGANIC ELECTROLUMINESCENT LIGHT EMITTING DEVICE

CROSS REFERENCE TO RELATED APPLICATION

This Application is a 371 of PCT/JP2016/075624 filed on Sep. 1, 2016 which, in turn, claimed the priority of Japanese Patent Application No. 2016-023707 filed on Feb. 10, 2016, both applications are incorporated herein by reference.

TECHNICAL FIELD

The present invention relates to an organic electroluminescence light emitting device having a moisture absorbent layer in a sealing component.

BACKGROUND ART

The organic electroluminescence (EL) light emitting device including an organic EL element has been put to practical use as a light emitting device allowing planar light emission. The organic EL light emitting device is used for a display and lighting equipment, and is expected to be further developed.

However, when the organic EL light emitting device is driven for a certain period, a non-light-emitting portion called dark spot is generated and grows, leading to deterioration in light emitting characteristics. A cause of generation of such a dark spot includes influence of water such as water vapor. Intrusion of an extremely small amount of water also has a great influence on characteristics of the organic EL element.

The organic EL light emitting device therefore requires suppression of deterioration in the organic EL element due to water to improve reliability. In a previously provided method to prevent deterioration in the organic EL element due to water, the organic EL element is covered with a sealing component including a barrier film, and a moisture absorbent is disposed within the sealing component (for example, see PTL 1, PTL 2, and PTL 3).

PTL 1 describes an organic EL light emitting device having a configuration in which the organic EL element is covered with a transparent multilayer barrier including a double barrier film, and a moisture absorbent is disposed in each of the inner and outer barrier films. PTL1 describes that the organic EL element is doubly covered with the barrier film including the moisture absorbent and thus improved in moisture-proof property.

PTL 2 describes an organic EL light emitting device, in which the organic EL element is sealed by a resin sealing layer, and a protective layer including a metal foil is provided over the resin sealing layer, and a moisture-absorbing layer is provided at a position so as to surround a light emitting region of a light emitting layer between the resin sealing layer and the protective layer. PTL 2 describes that the moisture-absorbing layer is formed to an outer side beyond an end of the light emitting region, and the resin sealing layer is formed up to the outside of the moisture-absorbing layer, thereby water intruding in the resin sealing layer is efficiently absorbed by the moisture-absorbing layer.

PTL 3 describes an organic EL light emitting device, in which an organic EL element is covered with a gas barrier sheet including a gas barrier film and a moisture-absorbing film, and the moisture-absorbing film is provided at a position so as to cover a top and a side surface of the organic EL element. PTL 3 describes that the side surface of the organic EL element is covered with the moisture absorbent layer, which suppresses influence of water on the organic EL element.

CITATION LIST

Patent Literature

PTL 1: Japanese Unexamined Patent Application Publication (Translation of PCT Application) No. 2009-514124
PTL 2: Japanese Unexamined Patent Application Publication No. 2014-154507
PTL 3: Japanese Unexamined Patent Application Publication No. 2011-20335

SUMMARY OF INVENTION

Technical Problem

However the configuration of each of PTL 1, PTL 2, and PTL 3 cannot sufficiently suppress influence of water on the organic EL element, and thus reliability of the organic EL light emitting device is not sufficiently achieved.

For example, the configuration of PTL 1 does not describe a disposed position of the moisture absorbent in the barrier film; hence, migration of intruding water cannot be limited to a direction toward the moisture absorbent. In addition, since the moisture absorbent is not in tight contact with the organic EL element and thus a space exists between them, water intruding into the barrier film may be diffused and easily reach the organic EL element before being captured by the moisture absorbent. Furthermore, since the moisture absorbent exists only in a narrow region with respect to the organic EL element, a slow moisture-absorbing rate of the moisture absorbent hastens arrival of water at the organic EL element.

In the configuration of PTL 2, water intruding into the sealing is preferentially guided to an end of the moisture-absorbing layer. In such a case, a region of the moisture-absorbing layer, which absorbs moisture and is deactivated, proceeds from the end to the center. Hence, continuously inwardly intruding water causes the end of the moisture-absorbing layer to be easily deactivated, and thus the water may reach the organic EL element before being captured by a non-deactivated portion of the moisture-absorbing layer.

In the configuration of PTL 3, since the gas barrier sheet is in tight contact with an element substrate with an adhesive in between in a region outside the moisture absorbent layer, water intrudes from a side surface into the sealing through the adhesive. However, since a gap is provided between the moisture absorbent layer and the substrate, the intruding water easily reaches the organic EL element without receiving an effect of the moisture absorbent layer.

As described above, each of the previously provided configurations does not allow the moisture absorbent disposed in the sealing component to sufficiently exhibit its ability, so that deterioration in the organic EL element due to water is not sufficiently suppressed. Consequently, reliability of the organic EL light emitting device is not sufficiently improved.

To solve the above-described problem, the present invention provides a reliable organic electroluminescence light emitting device capable of suppressing influence of water by a moisture absorbent.

Solution to Problem

The organic electroluminescence light emitting device of the present invention includes an organic electroluminescence element including a first electrode, an organic EL layer, and a second electrode provided on a flexible base material, and includes, on the flexible base material, a first sealing section that seals the organic electroluminescence element, a moisture absorbent layer provided on the first sealing section, and a second sealing section covering the moisture absorbent layer and the first sealing section.

Advantageous Effects of Invention

According to the present invention, a reliable organic electroluminescence light emitting device can be provided.

DESCRIPTION OF EMBODIMENTS

Figure 1:
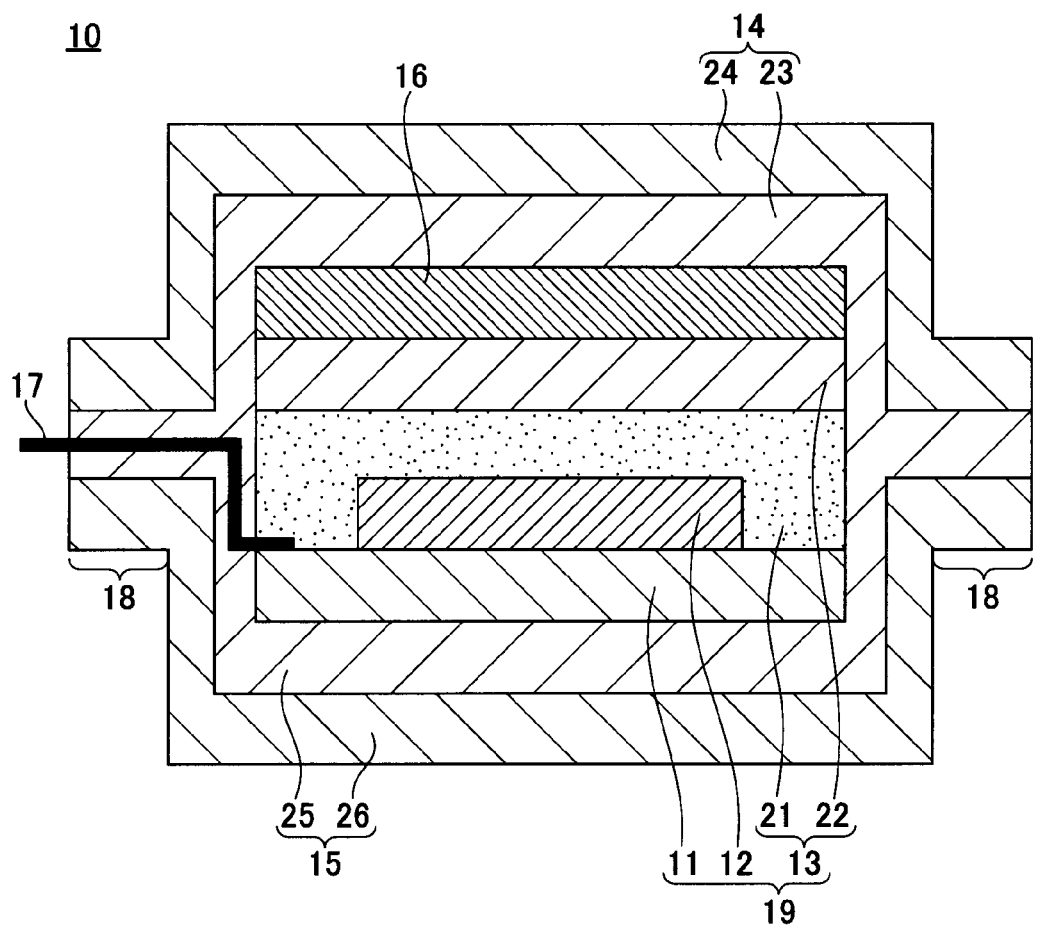
FIG. 1 illustrates a configuration of an organic EL light emitting device of a first embodiment.

Hereinafter, modes for carrying out the present invention are exemplarily, but not limitedly, described.
Description is made in the following order.
1. First embodiment of organic electroluminescence light emitting device.
2. Second embodiment of organic electroluminescence light emitting device.
3. Third embodiment of organic electroluminescence light emitting device.
4. Components of organic electroluminescence light emitting device.
1. First Embodiment of Organic Electroluminescence Light Emitting Device A specific embodiment of an organic electroluminescence light emitting device (hereinafter, organic EL light emitting device) of the present invention is now described. FIG. 1 shows a schematic configuration diagram of the organic EL light emitting device of a first embodiment. The organic EL light emitting device of FIG. 1 includes a bottom-emission-type organic electroluminescence element (hereinafter, organic EL element), in which light is extracted from a substrate side.

The organic EL light emitting device 10 of FIG. 1 includes an organic EL element 12 on a flexible base material 11. The organic EL light emitting device 10 includes a first sealing section 13 to seal the organic EL element 12, and a moisture absorbent layer 16 over the first sealing section 13. The organic EL light emitting device 10 further includes a second sealing section 14 and a third sealing section 15, which collectively seal the flexible base material 11, the organic EL element 12, the first sealing section 13, and the moisture absorbent layer 16. Furthermore, the organic EL light emitting device 10 includes flexible printed circuits (FPC) 17 to lead electrodes of the organic EL element 12 to the outsides of the second sealing section 14 and the third sealing section 15.

For example, the organic EL element 12 includes a first electrode (transparent electrode) formed on the flexible base material 11, an organic EL layer formed on the first electrode, and a second electrode (counter electrode) that holds the organic EL layer together with the first electrode. The first sealing section 13 is configured by a first resin sealing layer 21 and a first sealing substrate 22. The second sealing section 14 is configured by a second resin sealing layer 23 and a second sealing substrate 24. The third sealing section 15 is configured by a third resin sealing layer 25 and a third sealing substrate 26.

In the organic EL light emitting device 10, the organic EL element 12 is disposed on one surface of the flexible base material 11 (hereinafter, surface of the flexible base material 11). Specifically, the organic EL element 12 is disposed on the surface of the flexible base material 11, and is disposed on a side close to the center rather than the margin of the flexible base material 11 such that a circumferential portion of the surface of the flexible base material 11 is exposed around the organic EL element 12.

The organic EL element 12 is sealed by the first sealing section 13 on the flexible base material 11. Specifically, the organic EL element 12 is sealed in such a manner that the first resin sealing layer 21 covers over a surface (hereinafter, over the organic EL element 12) of the organic EL element 12 on a side opposite to the flexible base material 11 and a stacking surface side (hereinafter, side surface of the organic EL element 12) of the organic EL layer and the electrodes of the organic EL element 12. That is, in the organic EL element 12, one main surface is in contact with the flexible base material 11, and the other main surface, which is not in contact with the flexible base material 11, and the entire side surface are covered with the first resin sealing layer 21. The surrounding of the organic EL element 12 is therefore covered with the flexible base material 11 and the first resin sealing layer 21.

The first resin sealing layer 21 is also provided over the circumferential portion, which is exposed around the organic EL element 12, of the surface of the flexible base material 11. The first resin sealing layer 21 is provided up to an end of the flexible base material 11 so that the flexible base material 11 and the first resin sealing layer 21 have edges at roughly the same position. The first resin sealing layer 21 may cover at least the organic EL element 12, and does not need to cover the entire circumferential portion of the flexible base material 11. The flexible base material 11 may therefore be exposed from around the first resin sealing layer 21. The first resin sealing layer 21 is preferably in tight contact with the organic EL element 12 and the flexible base material 11 so that no gap exists between the first resin sealing layer 21, the organic EL element 12, and the flexible base material 11.

The first sealing substrate 22 is laminated to the first resin sealing layer 21. The first sealing substrate 22 is disposed over a surface (hereinafter, over the first resin sealing layer 21) of the first resin sealing layer 21 on a side opposite to the flexible base material 11. That is, in the first sealing section 13, the first resin sealing layer 21 covers the organic EL element 12 and bonds the first sealing substrate 22. The first sealing substrate 22 has a shape similar to that of the flexible base material 11 so that the flexible base material 11 and the first resin sealing layer 21 have edges at roughly the same position. The first sealing substrate 22 may be disposed over the first resin sealing layer 21, and may protrude from around the first resin sealing layer 21.

Lead lines for the electrodes of the organic EL element 12 are provided on the flexible base material 11 and connected to the FPC 17. The FPC 17 has a portion to be connected to the lead lines on the flexible base material 11, which is covered with the first resin sealing layer 21 and sealed by the first sealing section 13, as with the organic EL element 12.

The organic EL element 12 is thus held between the flexible base material 11 and the first sealing substrate 22. Such a structure allows the organic EL element 12 to be sealed by the flexible base material 11 and the first sealing section 13. Hereinafter, the configuration including the flexible base material 11, the organic EL element 12, and the first sealing section 13 of the structure is referred to as a first sealing unit 19. As long as the organic EL element 12 is sealed by the flexible base material 11 and the first sealing section 13, another configuration may be included in the first sealing unit 19. For example, there may be provided various layers between the flexible base material 11 and the organic EL element 12, or an inorganic sealing layer to seal the organic EL element 12.

The moisture absorbent layer 16 is disposed over the first sealing unit 19. The moisture absorbent layer 16 is disposed over a surface (hereinafter, over the first sealing substrate 22) of the first sealing substrate 22 on a side opposite to the first resin sealing layer 21 in the first sealing unit 19. The organic EL light emitting device 10 is configured such that light emitted by the organic EL element 12 is extracted from a flexible base material 11 side. Hence, the moisture absorbent layer 16 having a sufficient area is difficult to be disposed over the main surface on the flexible base material 11 side. The moisture absorbent layer 16 therefore must be disposed on a side opposite to a side, through which light is extracted from the organic EL element 12, of the first sealing unit 19 in order to provide a sufficient amount of moisture absorbent layer 16.

Any moisture absorbent layer 16 disposed over the first sealing substrate 22 may be used regardless of its shape and the like. For example, as shown in FIG. 1, the moisture absorbent layer 16 may be disposed such that the moisture absorbent layer 16 and the first sealing substrate 22 have the same shape and have edges at the same position. The moisture absorbent layer 16 may have area smaller than that of the first sealing substrate 22. For example, area of the moisture absorbent layer 16 is preferably at least 60%, more preferably at least 80%, of area of the first sealing substrate 22. The moisture absorbent layer 16 is preferably formed in a region wider than the organic EL layer of the organic EL element 12 while having an area lager than that of the organic EL layer. Furthermore, the moisture absorbent layer 16 may have an end that protrudes from the first sealing substrate 22 within a sealable range of the second sealing section 14, and may have a larger area than the first sealing substrate 22.

The moisture absorbent layer 16 may be directly formed over the first sealing substrate 22, or may be laminated to over the first sealing substrate 22 by the adhesive layer or the like. Even if another configuration is provided between the moisture absorbent layer 16 and the first sealing unit 19, the moisture absorbent layer 16 may be disposed above the first sealing unit 19.

In the organic EL light emitting device 10, the first sealing unit 19 and the moisture absorbent layer 16 are collectively sealed by the second sealing section 14 and the third sealing section 15. The second sealing section 14 includes the second resin sealing layer 23 covering the top of the moisture absorbent layer 16 and side surfaces of the moisture absorbent layer 16 and the first sealing unit 19, and a second sealing substrate 24 laminated to a top side of the first sealing unit 19 by the second resin sealing layer 23. The third sealing section 15 includes the third resin sealing layer 25 that covers a surface (hereinafter, back of the flexible base material 11) of the flexible base material 11 on a side having no organic EL element 12 and the side surface of the first sealing unit 19, and includes a third sealing substrate 26 laminated to a bottom side of the first sealing unit 19 by the third resin sealing layer 25.

The second resin sealing layer 23 of the second sealing section 14 covers from the top of the moisture absorbent layer 16 to a halfway point on a top side of the side surface of the first sealing unit 19. The third resin sealing layer 25 of the third sealing section 15 covers from the bottom of the first sealing unit 19 to a halfway point on a bottom side of the side surface of the first sealing unit 19. As a result, the first sealing unit 19 and the moisture absorbent layer 16 are collectively covered with the second resin sealing layer 23 and the third resin sealing layer 25.

The organic EL light emitting device 10 further includes a peripheral seal part 18, which includes the second sealing section 14 and the third sealing section directly laminated to each other, around the first sealing unit 19. The peripheral seal part 18 is a portion, in which the second resin sealing layer 23 is directly in contact with the third resin sealing layer 25 without the first sealing unit 19. The peripheral seal part 18 is provided over the entire circumference in a side surface direction of the first sealing unit 19.

The second resin sealing layer 23 or the third resin sealing layer 25 is preferably in tight contact with the first sealing unit 19 and/or the moisture absorbent layer 16 such that no gap is provided between the second resin sealing layer 23 or the third resin sealing layer 25 and one of the first sealing unit 19 and the moisture absorbent layer 16. Furthermore, in the peripheral seal part 18, the second resin sealing layer 23 and the third resin sealing layer 25 are preferably integrally in tight contact with each other so that no gap is provided between the second resin sealing layer 23 and the third resin sealing layer 25. In this way, the organic EL light emitting device 10 preferably has no gap in an internal area enclosed by the second sealing section 14 and the third sealing section 15.

That is, in the peripheral seal part 18 of the organic EL light emitting device 10, the second sealing substrate 24 and the third sealing substrate 26 are directly bonded together with the second resin sealing layer 23 and the third resin sealing layer 25 in between. Consequently, the entire circumference in the side surface direction of the first sealing unit 19 is tightly sealed by the second sealing section 14 and the third sealing section 15. As a result, the first sealing unit 19 and the moisture absorbent layer 16 are sealed by the second sealing section 14 and the third sealing section 15 that are bonded together over the entire circumference in the side surface direction of the first sealing unit 19.

The FPC 17 is led to the outside of the first sealing section 13, and a side of the FPC 17, which is connected to the organic EL element 12, is held by the second sealing section 14 and the third sealing section 15. The FPC 17 is led to the outside through the peripheral seal part 18 from between the second sealing section 14 and the third sealing section 15.

In the organic EL light emitting device 10, a stack of the first sealing unit 19 having the organic EL element 12 and the moisture absorbent layer 16 is completely covered with the second resin sealing layer 23 and the third resin sealing layer 25. The stack of the first sealing unit 19 and the moisture absorbent layer 16 is sealed by the second sealing substrate 24 and the third sealing substrate 26 with the second and third resin sealing layers 23 and 25 in between except the end of the peripheral seal part 18. In the organic EL light emitting device 10, therefore, the second sealing substrate 24 and the third sealing substrate 26 are exposed on the surface of the organic EL light emitting device 10 except the end portion of the peripheral seal part 18. The second sealing substrate 24 and the third sealing substrate 26 are not provided and thus the second resin sealing layer 23 and the third resin sealing layer 25 are exposed on the surface of the organic EL light emitting device 10 only in the end portion of the peripheral seal part 18.

As described above, the organic EL light emitting device 10 has a double sealing section for the organic EL element 12 by the inner sealing section including the first sealing section 13 and the outer sealing section including the second sealing section 14 and the third sealing section 15. Furthermore, the moisture absorbent layer 16 is provided between the inner sealing section and the outer sealing section. That is, the moisture absorbent layer 16 is provided on the outer side of the inner sealing section rather than within the inner sealing section in which the organic EL element 12 is disposed. The moisture absorbent layer 16 is sealed by the outer sealing section together with the first sealing unit 19 having the organic EL element 12. If the moisture absorbent layer 16 is provided on the outer side of the inner sealing section, another moisture absorbent layer may be provided within the inner sealing section in addition to the moisture absorbent layer 16. A moisture absorbent layer 16 may be further provided at another position.

In this way, the moisture absorbent layer 16 is provided on the outer side of the inner sealing section (first sealing section 13), and the moisture absorbent layer 16 is sealed by the outer sealing section (the second sealing section 14 and the third sealing section 15) together with the inner sealing section (first sealing section 13), allowing the moisture absorbent layer 16 to effectively act against water intruding into the organic EL light emitting device 10. This makes it possible to suppress influence of water on the organic EL element 12, and improve reliability of the organic EL light emitting device 10.

The moisture absorbent layer 16 can thus suppress influence of water on the organic EL element 12, and a mechanism of such suppression is now described. The following description is merely made as an estimation based on the above-described configuration, test results, and the like, and does not limit a mechanism of improving reliability of the organic EL light emitting device 10.

First, consideration is given to an intrusion path of water from outside into the organic EL light emitting device 10 and a path through which the intruding water goes up to the organic EL light element 12. Water intrusion from the outside into the organic EL light emitting device 10 is considered to occur mainly through three paths of side leakage, back intrusion, and light-emitting surface intrusion. The side leakage means water intrusion into the organic EL light emitting device 10 from the second resin sealing layer 23 and the third resin sealing layer 25 exposed at the end of the peripheral seal part 18. The back intrusion means intrusion of water into the organic EL light emitting device 10 after the water penetrates the second sealing substrate 24. The light-emitting surface intrusion means intrusion of water into the organic EL light emitting device 10 after the water penetrates the third sealing substrate 26.

The water through the side leakage, the back intrusion, and the light-emitting surface intrusion diffuses mainly in the second resin sealing layer 23 and the third resin sealing layer 25 in the second sealing section 14 and the third sealing section 15, respectively. The water diffuses in the second resin sealing layer 23 and the third resin sealing layer 25 and migrates to the first sealing unit 19, and then intrudes into the first sealing unit 19.

Three paths are considered as intrusion paths of water into the first sealing unit 19 as with the water intrusion into the organic EL light emitting device 10. Specifically, such possible paths include intrusion of water penetrating the flexible base material 11 (light-emitting surface intrusion), intrusion of water penetrating the first sealing substrate 22 (back intrusion), and intrusion of water from the first resin sealing layer 21 exposed on the side surface of the first sealing unit 19 (side leakage).

The water intruding in the first sealing unit 19 diffuses mainly in the first resin sealing layer 21. The water diffuses in the first resin sealing layer 21 and migrates to the organic EL element 12, causing damage to the organic EL element 12.

In this way, water probably affects the organic EL light element 12 through a first stage of intruding from the outside of the organic EL light emitting device 10 into the second sealing section 14 and the third sealing section 15, and a second stage of intruding from the second sealing section 14 and the third sealing section 15 into the flexible base material 11 and the first sealing section 13.

Specifically, in the configuration of PTL 1, a gap between the barrier film and the organic EL element is not filled with a sealing resin or the like, and the organic EL element is surrounded by the gap. Hence, water intruding in the barrier film diffuses in the gap at a high degree of freedom, and thus can easily reach the organic EL element before being absorbed by the moisture absorbent layer. Even if the barrier film is doubled, since a gap between such barrier films is not filled, water intruding in the outer barrier film freely diffuses in the gap, and thus easily intrudes into the inner barrier film before being absorbed by the moisture absorbent. As a result, the function of the moisture absorbent layer is not sufficiently exhibited, and water influentially migrates to the organic EL element.

In the configuration of PTL 2, a moisture absorbent layer is disposed on a resin sealing layer, and a sealing substrate is provided so as to cover the moisture absorbent layer. Hence, the moisture absorbent layer is disposed in the same sealing section as that for the organic EL element. This organic EL light emitting device has only such a sealing section having the moisture absorbent layer disposed therein, and does not externally have a configuration that suppresses water intrusion into the sealing section. Hence, water intrusion into the sealing section having the moisture absorbent layer depends on only the sealing ability of the resin sealing layer. The configuration therefore cannot suppress water intrusion beyond the sealing ability of the resin sealing layer. Furthermore, since a migration path of water intruding in the sealing section is not complicated, retention time of the water intruding in the sealing section cannot be increased in the resin sealing layer, and thus the water easily reach the organic EL element before being captured by the moisture absorbent layer. As a result, the water reaches the organic EL element while the moisture absorbent layer does not sufficiently exhibit its ability.

In the configuration of PTL 3, as with the configuration of PTL 2, the moisture absorbent layer is disposed in the same sealing section as that for the organic EL element, and the organic EL light emitting device does not externally have a configuration that suppresses water intrusion into the sealing section. The configuration therefore cannot suppress water intrusion into the sealing section having the moisture absorbent layer beyond the sealing ability of the resin sealing layer. Furthermore, a migration path of water intruding in the sealing section is not complicated, and thus retention time of the water intruding in the sealing section cannot be increased in the resin sealing layer. As a result, ability of the moisture absorbent layer is not sufficiently exhibited against the water intruding in the sealing section, and thus the water easily reach the organic EL element before being captured by the moisture absorbent layer.

In contrast, the organic EL light emitting device 10 allows high barrier performance to be maintained by the second sealing substrate 24 and the third sealing substrate 26, leading to extremely little back intrusion and light-emitting surface intrusion. In addition, the inner sealing section including the first sealing unit 19 is sealed by the outer sealing section including the second sealing section 14 and the third sealing section 15, i.e., a double sealing section is provided. This results in a complicated migration path, through which water intrudes from the outside into the organic EL light emitting device 10 and migrates to the organic EL element 12.

Furthermore, in the organic EL light emitting device 10, the first resin sealing layer 21, the second resin sealing layer 23, and the third resin sealing layer can suppress diffusion of water, and thus water is less likely to migrate in the resin sealing layers. As a result, even if water intrudes into the second resin sealing layer 23 and the third resin sealing layer 25 through the side leakage, the back intrusion, and the light-emitting surface intrusion, water advance is greatly slowed in the second resin sealing layer 23 and the third resin sealing layer 25, so that arrival of the water at the first sealing unit 19 can be further delayed. Furthermore, even if water reaches the first sealing unit 19, water advance can be greatly slowed by the first resin sealing layer 21. In this way, the configuration of the organic EL light emitting device 10 makes it possible to extremely slow advance of the intruding water by the resin sealing layers. It is therefore possible to suppress influence of water, which intrudes from the outside of the organic EL light emitting device 10, on the organic EL element 12.

In the organic EL light emitting device 10, since the moisture absorbent layer 16 is disposed on the outer side of the first sealing section 13, water, which intrudes from the outside of the organic EL light emitting device 10 into the second sealing section 14 and the third sealing section 15, can be absorbed by the moisture absorbent layer 16. Specifically, while water intrudes into the second resin sealing layer 23 and the third resin sealing layer 25 and diffuses in the second resin sealing layer 23 and the third resin sealing layer 25, the water can be captured by the moisture absorbent layer 16 before reaching the first sealing unit 19.

More specifically, the organic EL light emitting device 10 includes the moisture absorbent layer 16 and the first sealing section 13 between the second resin sealing layer 23 and the organic EL element 12, and includes the flexible base material 11 between the third resin sealing layer 25 and the organic EL element 12. As a result, while water intrudes into the organic EL element 12 from within the second resin sealing layer 23 and the third resin sealing layer 25 through the first sealing substrate 22 of the first sealing section 13 (back intrusion), the water is captured by the entire surface of the moisture absorbent layer 16; hence, intrusion of the water is blocked.

The flexible base material 11 blocks water intrusion (light-emitting surface intrusion) from within the second resin sealing layer 23 and the third resin sealing layer 25 into the organic EL element 12 through the light-emitting surface side. Similarly, for water intrusion from the side surface of the first resin sealing to layer 21 (side leakage), since a path to the first resin sealing layer 21 includes only the side surface of the first sealing unit 19 sealed by the second resin sealing layer 23 and the third resin sealing layer 25, the water migration path is complicated. The water migration path for intrusion into the first sealing unit 19 is thus complicated, which increases the retention time of water in the second resin sealing layer 23 and the third resin sealing layer 25. Such increased retention time makes it possible to capture the water diffusing in the second resin sealing layer 23 and the third resin sealing layer 25 by the moisture absorbent layer 16 before the water intrudes into the first sealing unit 19.

For water intrusion through the FPC 17, for example, water penetrating the FPC 17, or water intruding from the interface between the FPC 17 and the second sealing section 14 or the third sealing section 15, the moisture absorbent layer 16 also effectively functions by the first sealing section 13 sealing the organic EL element 12, and the second sealing section 14 and the third sealing section 15 sealing the first sealing section 13 and the flexible base material 11, respectively, as described above. It is therefore possible to suppress influence of the water on the organic EL element 12 through the FPC 17 and thus maintain reliability of the organic EL light emitting device 10.

As described above, in the organic EL light emitting device 10, the moisture absorbent layer 16 is sealed by the inner sealing section (first sealing section 13) and the outer sealing section (the second sealing section 14 and the third sealing section 15), allowing the moisture absorbent layer 16 to efficiently act against the intruding water. In addition, such a configuration makes it possible to suppress influence of the water on the organic EL element 12, and improve reliability of the organic EL light emitting device 10.

2. Second Embodiment of Organic Electroluminescence Light Emitting Device

Figure 2:
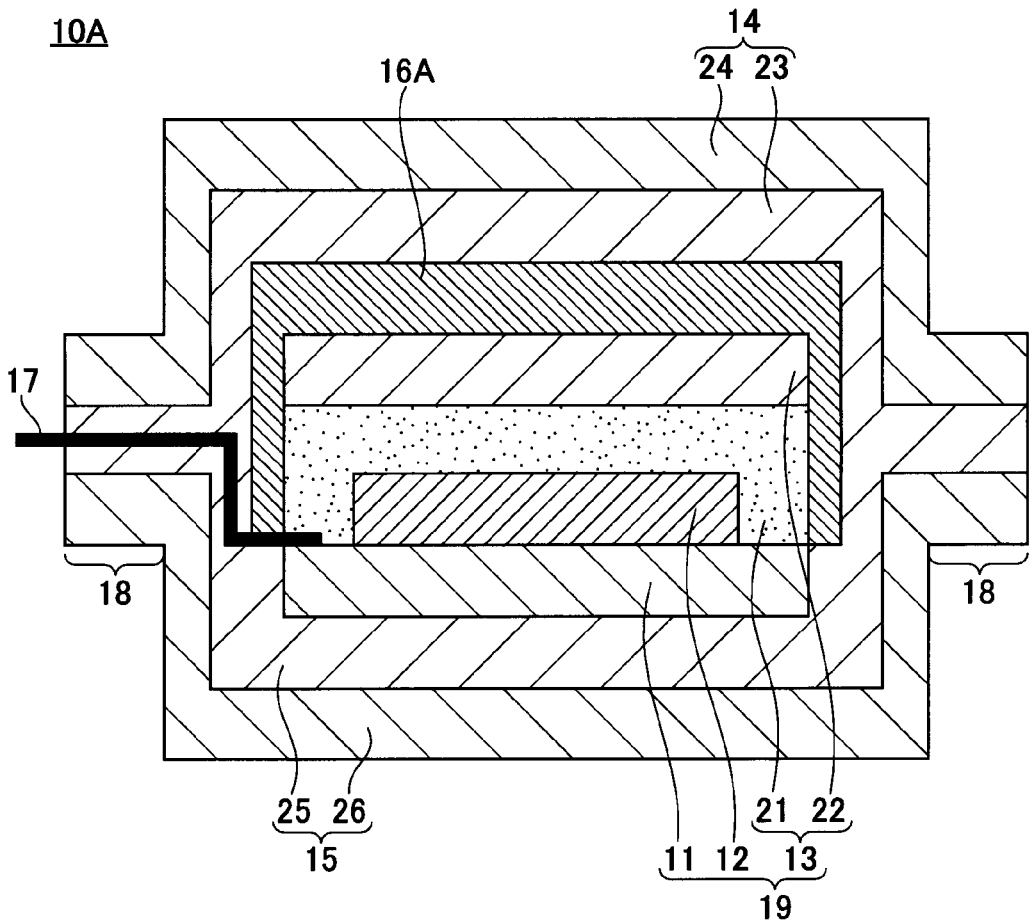
FIG. 2 illustrates a configuration of an organic EL light emitting device of a second embodiment.

A second embodiment of the organic EL light emitting device is now described. FIG. 2 shows a configuration of the organic EL light emitting device of the second embodiment. The organic EL light emitting device 10A of FIG. 2 includes the organic EL element 12 on the flexible base material 11. The organic EL light emitting device 10A includes the first sealing section 13 to seal the organic EL element 12, and a moisture absorbent layer 16A covering the top and the side surface of the first sealing section 13. The organic EL light emitting device 10A further includes the second sealing section 14 and the third sealing section 15, which collectively seal the flexible base material 11, the organic EL element 12, the first sealing section 13, and the moisture absorbent layer 16A. Furthermore, the organic EL light emitting device 10A includes the flexible printed circuits (FPC) 17 to lead electrodes of the organic EL element 12 to the outsides of the second sealing section 14 and the third sealing section 15.

The configuration of the organic EL light emitting device 10A of FIG. 2 is the same as that of the organic EL light emitting device of the first embodiment except for a configuration of the moisture absorbent layer 16A. In the following, therefore, only the configuration of the moisture absorbent layer 16A is described, and description of other configurations is omitted.

In the organic EL light emitting device 10A, the moisture absorbent layer 16A is provided at a position so as to cover from the top to the side surface of the first sealing unit 19. That is, the moisture absorbent layer 16A is provided so as to continuously cover from over a surface (hereinafter, over the first sealing substrate 22 or over the first sealing section 13) of the first sealing substrate 22 on a side opposite to the first resin sealing layer 21 to a stacking surface side (hereinafter, side surface of the first sealing section 13) of the first resin sealing layer 21 and the first sealing substrate 22.

With the side surface of the first sealing section 13, the moisture absorbent layer 16A may cover the entire side surface of the first sealing section 13 or may cover from over the first sealing section 13 to a halfway point of the side surface of the first sealing section 13. The moisture absorbent layer 16A covering the side surface of the first sealing section 13 may be, or does not need to be, in contact with the flexible base material 11. The moisture absorbent layer 16A preferably, but not necessarily, entirely covers over the first sealing section 13. The moisture absorbent layer 16A is preferably continuously provided between over the first sealing section 13 and the side surface of the first sealing section 13, but may be discontinuous therebetween. For example, the moisture absorbent layer 16A covering over the first sealing section 13 may be provided separately from the moisture absorbent layer 16A covering the side surface of the first sealing section 13.

The moisture absorbent layer 16 may be formed so as to be directly in contact with the first sealing unit 19, or may be laminated to the first sealing unit 19 with an adhesive layer or the like. Another configuration may be provided between the moisture absorbent layer 16A and the first sealing unit 19 as long as the moisture absorbent layer 16A is disposed outside the first sealing unit 19.

In the organic EL light emitting device 10A, the moisture absorbent layer 16A covers up to the side surface of the first sealing section 13, making it possible to suppress intrusion of water into the first sealing unit 19 by the side leakage. In the first sealing unit 19, since the moisture absorbent layer 16A covers over the first sealing substrate 22, water intrusion through the first sealing substrate 22 (back intrusion) is considered to be extremely little. When the flexible base material 11 is configured of a gas barrier film, water intrusion through the flexible base material 11 (light-emitting surface intrusion) is also considered to be extremely little. Hence, intrusion of water through the first resin sealing layer 21 exposed on the side surface of the first sealing unit 19 (side leakage) is considered to be a main water intrusion path into the first sealing unit 19.

Hence, the moisture absorbent layer 16A covers up to the side surface of the first sealing unit 19, which tends to be a water intrusion path, and is thus allowed to capture water that is going to migrate from the side surface of the first resin sealing layer 21 into the first sealing section 13. This makes it possible to suppress intrusion of water into the first sealing section 13 by the side leakage, leading to improvement in reliability of the organic EL light emitting device 10A.

In addition, the moisture absorbent layer 16A covers from the top to the side surface of the first sealing section 13, making it possible to increase formation area of the moisture absorbent layer 16A compared with the case where the moisture absorbent layer 16A is formed only over the top of the first sealing section 13. That is, the volume of the moisture absorbent layer 16A can be increased at a thickness allowed, making it possible to increase moisture absorption capacity of the moisture absorbent layer 16A.

An increase in moisture absorption capacity of the moisture absorbent layer 16A leads to an increase in time up to deactivation of the moisture absorbent layer 16A. Furthermore, in the configuration of the organic EL light emitting device 10A, the moisture absorbent layer 16A is disposed outside the first sealing unit 19, and the first sealing unit 19 and the moisture absorbent layer 16A are sealed by the second sealing section 14 and the third sealing section 15, thereby the moisture-absorbing function of the moisture absorbent layer 16A can be sufficiently exhibited. As a result, an increase in capacity of the moisture absorbent layer 16A tends to greatly affect time spent before influence of water on the organic EL element 12 occurs. Consequently, the increase in area of the moisture absorbent layer 16A makes it possible to increase time up to deactivation of the moisture absorbent layer 16A, leading to improvement in reliability of the organic EL light emitting device 10A.

3. Third Embodiment of Organic Electroluminescence Light Emitting Device

Figure 3:
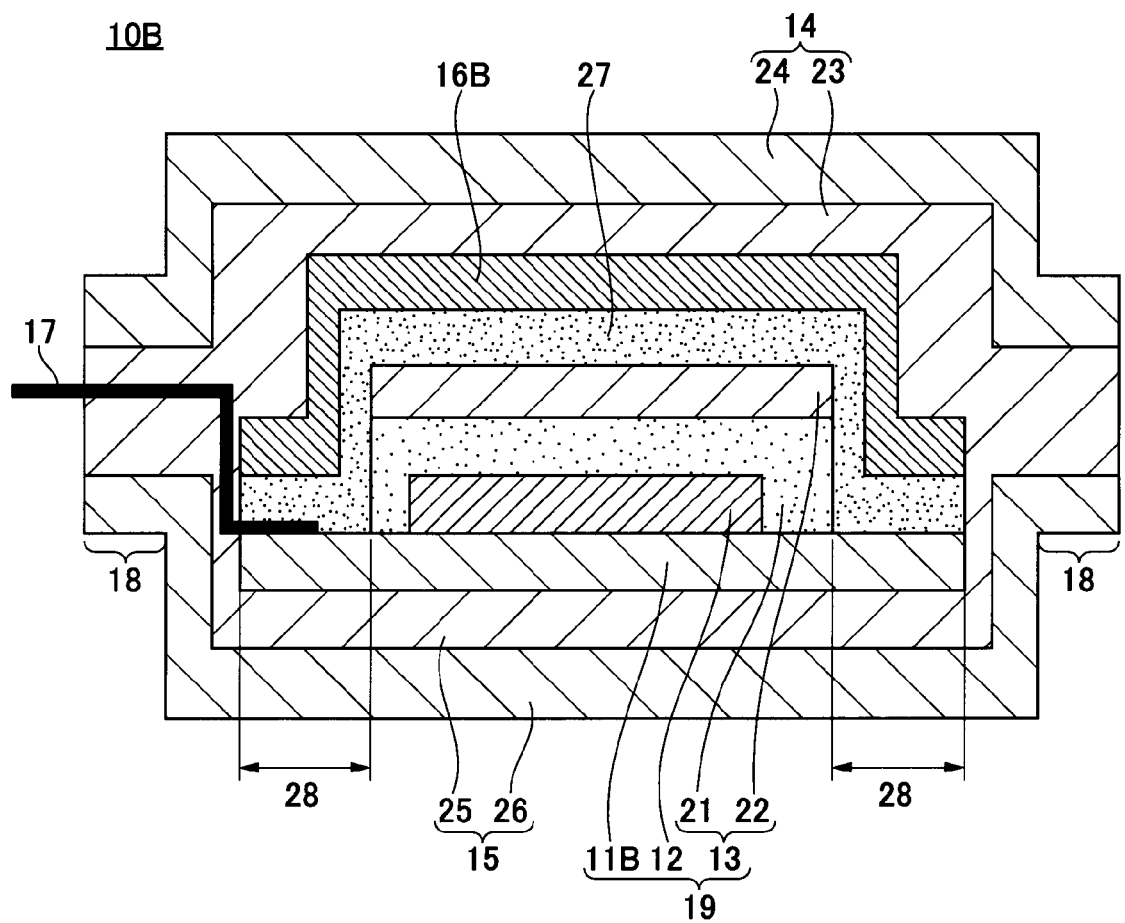
FIG. 3 illustrates a configuration of an organic EL light emitting device of a third embodiment.

A third embodiment of the organic EL light emitting device is now described. FIG. 3 shows a configuration of the organic EL light emitting device of the third embodiment. The organic EL light emitting device 10B of FIG. 3 includes the organic EL element 12 on a flexible base material 11B. The organic EL light emitting device 10B further includes the first sealing section 13 to seal the organic EL element 12. The organic EL light emitting device 10B further includes the adhesive layer 27 that covers the top and the side surface of the first sealing section 13 and further covers on the flexible base material 11B, and a moisture absorbent layer 16B laminated to the first sealing section 13 and the flexible base material 11B with the adhesive layer 27. The organic EL light emitting device 10B further includes the second sealing section 14 and the third sealing section 15, which collectively seal the flexible base material 11B, the organic EL element 12, the first sealing section 13, the adhesive layer 27, and the moisture absorbent layer 16B. Furthermore, the organic EL light emitting device 10B includes the flexible printed circuits (FPC) 17 to lead electrodes of the organic EL element 12 to the outsides of the second sealing section 14 and the third sealing section 15.

The configuration of the organic EL light emitting device 10B of FIG. 3 is the same as that of the organic EL light emitting device of the first or second embodiment except for configurations of the flexible base material 11B, the adhesive layer 27, and the moisture absorbent layer 16B. In the following, therefore, only the configurations of the flexible base material 11B, the adhesive layer 27, and the moisture absorbent layer 16B are described, and description of other configurations is omitted.

In the organic EL light emitting device 10B, area of a main surface, on which the organic EL element 12 is mounted, of the flexible base material 11B is larger than area of the first sealing section 13. As a result, the surface of the flexible base material 11B has a marginal region 28 having no first resin sealing layer 21 around the first sealing section 13. The marginal region 28 may be provided over the entire or a partial circumference of the first sealing section 13 on the surface of the flexible base material 11B.

The adhesive layer 27 is provided continuously over the top of the first sealing section 13 provided on the flexible base material 11B, the side surface of the first sealing section 13, and the marginal region 28 of the flexible base material 11B. The moisture absorbent layer 16B is continuously laminated, with the adhesive layer 27, to the top of the first sealing section 13, the side surface of the first sealing section 13, and the flexible base material 11B in the marginal region 28 around the first sealing section 13.

If each of the adhesive layer 27 and the moisture absorbent layer 16B covers the top and the side surface of the first sealing section 13 and continuously covers up to the marginal region 28 of the flexible base material 11B, the marginal region 28 does not need to be entirely covered. The moisture absorbent layer 16B may cover at least part of the top of the first sealing section 13, at least part of the side surface of the first sealing section 13, and at least part of the marginal region 28 of the flexible base material 11B. The moisture absorbent layer 16B is preferably provided over the entire top of the first sealing section 13 to increase the mounting area of the moisture absorbent layer 16B. Similarly, the moisture absorbent layer 16B is preferably provided over the entire side surface of the first sealing section 13 and over the entire marginal region 28.

The adhesive layer 27 may be discontinuous between the top of the first sealing section 13, the side surface of the first sealing section 13, and the marginal region 28 of the flexible base material 11B. Since a gap having a high degree of freedom of water diffusion is preferably not formed, the adhesive layer 27 is preferably provided continuously from the top of the first sealing section 13 to the marginal region 28 of the flexible base material 11B.

Although the adhesive layer 27 is used to laminate the moisture absorbent layer 16B in the organic EL light emitting device 10B, the moisture absorbent layer 16B may be directly provided over the top of the first sealing section 13, the side surface of the first sealing section 13, and the marginal region 28 of the flexible base material 11B without the adhesive layer 27. The adhesive layer 27 may be partially provided between the moisture absorbent layer 16B, the flexible base material 11B, and the first sealing section 13, for example, only over the first sealing substrate 22 or the marginal region 28. Furthermore, another layer may be provided in place of the adhesive layer 27 to laminate the moisture absorbent layer 16B.

In the configuration of the organic EL light emitting device 10B, the water path for migration from the second resin sealing layer 23 or the third resin sealing layer 25 to the first sealing section is more complicated than that in each of the first and second embodiments. Specifically, the first resin sealing layer 21 exposed on the side surface of the first sealing section 13 is covered with the adhesive layer 27 and the moisture absorbent layer 16B. As a result, side leakage into the first sealing section 13 occurs through the inside of the adhesive layer 27, which is formed between the moisture absorbent layer 16B and the flexible base material 11B, as a main intrusion path of water. The configuration of the organic EL light emitting device 10B therefore can more limit the water migration path from the second resin sealing layer 23 or the third resin sealing layer 25 to the first sealing section 21, and thus can suppress water intrusion into the first sealing section 13.

Water intruding in the adhesive layer 27 diffuses within the adhesive layer 27 and thus can migrate to the first sealing section. However, since water less migrates in the adhesive layer 27 than in the gap as in the resin sealing layer, retention time of water in the adhesive layer 27 can be increased. The adhesive layer 27 is directly in contact with the moisture absorbent layer 16B from the end of the adhesive layer 27, which is exposed between the moisture absorbent layer 16B and the flexible base material 11B and causes water intrusion, to the inside of the marginal region 28. Hence, water intruding in the adhesive layer 27 is easily captured by the moisture absorbent layer 16B during retention in the marginal region 28.

Side leakage in the first sealing unit 19 is considered to occur by water intrusion from the first resin sealing layer 21 and water intrusion through an interface between the flexible base material 11B and the first resin sealing layer 21. The interface between the flexible base material 11B and the first resin sealing layer 21 is microscopically not completely integrated and is thus not formed with a continuous composition. As a result, water may intrude through the interface between the flexible base material 11B and the first resin sealing layer 21.

In the configuration of the organic EL light emitting device 10B, the interface between the flexible base material 11B and the first resin sealing layer 21 is covered with the adhesive layer 27 and the moisture absorbent layer 16B, which makes it possible to suppress such water intruding through the interface between the flexible base material 11B and the first resin sealing layer 21. Furthermore, in the configuration of the organic EL light emitting device 10B, water intruding in the interface between the adhesive layer 27 and the flexible base material 11B is easily captured by the moisture absorbent layer 16B in the marginal region 28.

A distance from the interface between the adhesive layer 27 and the flexible base material 11B to the moisture absorbent layer 16B in the marginal region 28 of the organic EL light emitting device 10B is smaller than a distance from the interface between the flexible base material 11 and the first resin sealing layer 21 to the moisture absorbent layer 16 in the configuration of the organic EL light emitting device 10 of FIG. 1 or the organic EL light emitting device 10A of FIG. 2. Hence, water intruding in the interface between the adhesive layer 27 and the flexible base material 11B (FIG. 3) is more easily captured by the moisture absorbent layer 16B than water intruding in the interface between the first resin sealing layer 21 and the flexible base material 11 (FIGS. 1 and 2).

In particular, the retention time of water in the marginal region 28 is affected by length of the marginal region 28. That is, the larger the length of the marginal region 28, the longer the retention time of water in the adhesive layer 27 in the marginal region 28. Hence, increasing the length of the marginal region 28 makes it possible to increase the retention time of water, and thus increase capture probability of water by the moisture absorbent layer 16B.

Thickness of the adhesive layer 27 in the marginal region 28 has influence on water intrusion from the end of the adhesive layer 27 and on the capture probability of water by the moisture absorbent layer 16B. Specifically, reducing the thickness of the adhesive layer 27 in the marginal region 28 makes it possible to suppress the water intrusion from the end of the adhesive layer 27. Furthermore, reducing the thickness of the adhesive layer 27 allows water in the adhesive layer 27 and at the interface between the adhesive layer 27 and the flexible base material 11B to be easily captured by the moisture absorbent layer 16B in the marginal region 28.

Hence, enlarging the marginal region 28 and thinning the adhesive layer 27 in the marginal region 28 makes it possible to suppress water migration to the first sealing section 13, and thus suppress influence of water on the organic EL element 12. Consequently, reliability of the organic EL light emitting device 10B is improved by enlarging the marginal region 28 and thinning the adhesive layer 27.

4. Components of Organic Electroluminescence Light Emitting Device

The components of the organic EL light emitting devices described in the first to third embodiments are now described in detail. The following description is exemplarily made on possible components of the organic EL light emitting devices of the embodiments, and any other configuration that achieves the functions and the effects of the organic EL light emitting device may also be used.

Flexible Base Material

Any flexible base material having a high light transmittivity may be used as the flexible base material without limitation. For example, the flexible base material preferably includes a resin substrate and a resin film, and more preferably includes a transparent resin film in light of productivity and performance such as lightweight and flexibility.

Any resin can be used as the flexible base material without limitation, including, for example, polyethylene terephthalate (PET), polyethylene naphthalate (PEN), polyester resin such as modified polyester, polyethylene (PE) resin, polypropylene (PP) resin, polystyrene resin, polyolefin resin such as cyclic olefin resin, vinyl resin such as polyvinyl chloride and polyvinylidene chloride, polyetheretherketone (PEEK) resin, polysulfone (PSF) resin, polyethersulfone (PES) resin, polycarbonate (PC) resin, polyamide resin, polyimide resin, acrylic resin, and triacetylcellulose (TAC) resin. Such types of resin may be used singly or in combination. The flexible base material may be a non-stretched film or a stretched film.

The flexible base material having a high transparency is preferred because a transparent electrode can be used as a transparent electrode of an electronic device. The high transparency means that total light transmittance in a visible light wavelength region, which is determined by a method in accordance with JIS K 7361-1:1997 (Plastics-Determination of the total luminous transmittance of transparent materials), is 50% or more, preferably 80% or more.

The flexible base material is preferably a gas barrier film having a gas barrier layer. The flexible base material is preferably a gas barrier film (gas barrier film or the like) having a water vapor transmission rate, which is determined by a method in accordance with JIS K 7129-1992 (25±0.5° C., relative humidity 90±2% RH), of 0.01 g/(m$^2$·24 h) or less. Furthermore, the flexible base material preferably has an oxygen transmission rate, which is determined by a method in accordance with JIS K 7126-1987, of $1\times10^{-3}$ ml/(m$^2$·24 h·atm) and the water vapor transmission rate of $1\times10^{-5}$ g/(m$^2$·24 h) or less. Any known gas barrier layer can be used to configure the flexible base material without limitation, as long as it achieves the above-described gas barrier properties. If the flexible base material is not a gas barrier film, a gas barrier layer that achieves the gas barrier properties is preferably provided on one surface of the flexible base material.

Organic EL Element

The organic EL element includes a transparent electrode, a counter electrode, and an organic EL layer as an organic function layer between the electrodes. The organic EL layer is a light emitting unit including an organic layer containing at least one of various organic compounds. The organic EL layer is held between a pair of electrodes including a positive electrode and a negative electrode, and emits light through recombination of supplied holes and electrons in the organic EL layer. The organic EL element may include a plurality of organic EL layers depending on desired emission colors.

The layer structure of the organic EL element may be a typical layer structure without limitation. For example, a stack configuration of a hole injection layer, a hole transport layer, an organic EL layer, an electron transport layer, and an electron injection layer can be exemplified. The hole injection layer and the hole transport layer may be provided as a hole transport-injection layer. The electron transport layer and the electron injection layer may be provided as an electron transport-injection layer. The electron injection layer may be configured of an inorganic material, for example.

The organic EL element may have a so-called tandem structure including one or more organic EL layers being stacked. Specific examples of the tandem organic EL element include element configurations and componential materials described in U.S. Pat. Nos. 6,337,492, 7,420,203, 7,473,923, 6,872,472, 6,107,734, 6,337,492, International Publication WO 2005/009087, Japanese Unexamined Patent Application Publication No. 2006-228712, Japanese Unexamined Patent Application Publication No. 2006-24791, Japanese Unexamined Patent Application Publication No. 2006-49393, Japanese Unexamined Patent Application Publication No. 2006-49394, Japanese Unexamined Patent Application Publication No. 2006-49396, Japanese Unexamined Patent Application Publication No. 2011-96679, Japanese Unexamined Patent Application Publication No. 2005-340187, Japanese Patent No. 4711424, Japanese Patent No. 3496681, Japanese Patent No. 3884564, Japanese Patent No. 4213169, Japanese Unexamined Patent Application Publication No. 2010-192719, Japanese Unexamined Patent Application Publication No. 2009-076929, Japanese Unexamined Patent Application Publication No. 2008-078414, Japanese Unexamined Patent Application Publication No. 2007-059848, Japanese Unexamined Patent Application Publication No. 2003-272860, Japanese Unexamined Patent Application Publication No. 2003-045676, and International Publication WO 2005/094130, for example.

Moisture Absorbent Layer

The moisture absorbent layer is configured of a moisture-absorbing compound. Examples of such a configuration include a configuration including only the moisture-absorbing compound, and a configuration where a particular moisture-absorbing compound or particles containing the moisture-absorbing compound is/are dispersed in a binder resin. A sheet-like moisture absorbent layer can be used as the moisture absorbent layer. A usable moisture absorbent layer includes a sheet-like moisture absorbent layer including a moisture absorbent layer, which contains a binder resin and the moisture-absorbing compound, formed on a support.

Any moisture-absorbing compound having a water adsorption function can be used without limitation. A preferred moisture-absorbing compound is capable of chemically adsorbing water, and maintains a solid state even after adsorbing water.

The moisture-absorbing compound to be used in the moisture absorbent layer includes metal oxide (for example, sodium oxide, potassium oxide, calcium oxide, barium oxide, magnesium oxide, and aluminum oxide), sulfate (for example, lithium sulfide, sodium sulfide, calcium sulfide, magnesium sulfide, cobalt sulfide, gallium sulfide, titanium sulfide, and nickel sulfide), metal halide (for example, calcium chloride, magnesium chloride, cesium fluoride, tantalum fluoride, cerium boride, magnesium boride, barium iodide, and magnesium iodide), perchlorate (for example, barium perchlorate and magnesium perchlorate). In particular, anhydride is preferably used in sulfate, metal halide, and perchlorate. Moisture-absorbing silica powder, molecular sieve powder, and the like can also be used as the moisture-absorbing compound.

At least one selected from among alkaline earth metal, alkali metal, alkaline earth metal oxide, alkali metal oxide, and inorganic porous material is preferably used as the moisture-absorbing compound. Furthermore, preferably used is moisture-absorbing particles containing at least one selected from among such moisture-absorbing compounds or particles of at least one selected from among the moisture-absorbing compounds.

A preferred material for the binder resin used in the moisture absorbent layer does not hinder the water adsorption function of the moisture absorbent component, and has a high gas permeability. Examples of the binder resin include polymer materials such as a polyolefin polymer, polyacrylic polymer, polyacrylonitrile polymer, polyamide polymer, polyester polymer, epoxy polymer, polycarbonate polymer, and fluorine polymer. The moisture absorbent layer including the moisture-absorbing compound and the binder resin preferably includes 95 to 60 mass % of the moisture-absorbing compound and 5 to 40 mass % of the binder resin.

Sealing Substrate

The sealing substrate is a component that covers the respective sealing sections to seal the organic EL element, and is fixed to the flexible base material and the like by the resin sealing layer. The shape of the sealing substrate is not limited to a sheet shape, and may be another shape such as a film shape.

The first sealing substrate, the second sealing substrate, and the third sealing substrate used in the organic EL light emitting devices of the above-described embodiments may have the same configuration or different configurations. However, the third sealing substrate, which is a substrate on a light extraction side of the organic EL light emitting device, is preferably transparent as with the flexible base material.

A known substrate used for sealing the organic EL element can be used as the sealing substrate. Examples of such a substrate include a glass substrate, a polymer substrate, and a metal substrate. A film-like sealing substrate may be formed by thinning each of such materials and used. The glass substrate specifically includes soda-lime glass, barium and strontium-containing glass, lead glass, aluminosilicate glass, borosilicate glass, barium-borosilicate glass, and quartz. The polymer substrate includes polycarbonate, acryl, polyethylene terephthalate, polyether sulfide, and polysulfone. The metal substrate includes at least one metal selected from among stainless steel, iron, copper, aluminum, magnesium, nickel, zinc, chromium, titanium, molybdenum, silicon, germanium, and tantalum, and alloy containing such metal. In particular, the polymer substrate or the metal substrate is preferably formed into a thin film shape and used as the sealing substrate because the organic EL element can be thinned. The sealing substrate may also be processed into a concave sheet shape and used. In such a case, the above-described materials of the sealing substrate are each subjected to processing such as sandblast or chemical etching to form a concave structure in the sealing substrate.

Furthermore, the sealing substrate preferably has an oxygen transmission rate, which is determined by a method in accordance with JIS K 7126-1987, of $1\times10^{-3}$ ml/(m$^2$·24 h·atm) and a water vapor transmission rate, which is determined by a method in accordance with JIS K 7129-1992 (25±0.5° C., relative humidity (90±2) % RH), of $1\times10^{-3}$ g/(m$^2$·24 h) or less.

Resin Sealing Layer

The resin sealing layer fixes the sealing substrate to the flexible base material and the like, and is used as a sealing agent to seal the organic EL element. The first resin sealing layers, the second resin sealing layers, or the third resin sealing layers used in the organic EL light emitting devices of the above-described embodiments may have the same configuration or different configurations. However, the third resin sealing layer, which is a resin sealing layer on a light extraction side of the organic EL light emitting device, is preferably transparent as with the flexible base material.

A known resin used for sealing the organic EL element can be used as the resin sealing layer. Examples of a usable resin include a photo-curing or thermosetting adhesive having a reactive vinyl group of an acrylate oligomer or a methacrylate oligomer, and a moisture curing adhesive of 2-cyanoacylic acid ester or the like. In addition, thermosetting and chemical curing (two-part) adhesives such as an epoxy adhesive can be used for the resin sealing layer. Hot-melt adhesives of polyamide, polyester, and polyolefin may also be used. An ultraviolet cure epoxy resin adhesive of a cation curing type may also be used.

The resin sealing layer may be applied by printing using a commercially available dispenser onto the sealing substrate like screen printing. An organic material configuring the organic EL element may be deteriorated through heat treatment. Hence, the resin sealing layer is preferably adherable and curable at a temperature from room temperature (25° C.) to 80° C. A desiccant may be dispersed in the resin sealing layer.

Adhesive Layer

When the adhesive layer is used for lamination of the moisture absorbent layer in the organic EL light emitting device, the same adhesive as that of the resin sealing layer can be used for the adhesive layer. When the adhesive layer is used, the adhesive is applied onto one surface of the moisture absorbent layer, for example, a surface on the support side of a sheet-like moisture absorbent layer, and the moisture absorbent layer with the adhesive is laminated onto the first sealing unit. Alternatively, the adhesive is applied onto a surface, on which the moisture absorbent layer is disposed, of the first sealing unit, and the moisture absorbent layer is laminated onto the adhesive. Consequently, the adhesive layer is provided between the first sealing unit and the moisture absorbent layer so as to laminate the first sealing unit to the moisture absorbent layer.

Method of Manufacturing Organic EL Light Emitting Device

A method of manufacturing the organic EL light emitting device is now described. In the following, a method of manufacturing the organic EL light emitting device 10 of FIG. 1 is mainly described as an example of the method of manufacturing the organic EL light emitting device. A method of manufacturing the organic EL light emitting device 10A or 10B of FIG. 2 or 3 is also described as necessary.

The method of manufacturing the organic EL light emitting device 10 includes a step of producing the organic EL element 12, a step of sealing the organic EL element 12 by the first sealing section 13 and the flexible base material 11 (step of forming the first sealing unit 19), a step of providing the moisture absorbent layer 16 over the first sealing section 13, and a step of sealing the first sealing unit 19 and the moisture absorbent layer 16 by the second sealing section 14 and the third sealing section 15. The method of manufacturing the organic EL light emitting device 10 may include another step as necessary.

Step of Producing Organic EL Element

First, the organic EL element 12 is produced on the flexible base material 11. In a production of the organic EL element 12, for example, a transparent electrode is formed on a prepared flexible base material 11 by an appropriate film formation process such as an evaporation process or a sputter process. Subsequently, a hole injection layer, a hole transport layer, a light emitting layer, an electron transport layer, and an electron injection layer are formed in this order to form the organic EL layer. The film formation processes of such layers include a spin coat process, a cast process, an inkjet process, an evaporation process, a printing process, and the like, and the vacuum evaporation process or the spin coat process is particularly preferred because of easy production of a homogenous film, hard formation of pinholes, and the like. The layers may be formed by different processes. When the organic EL element 12 is formed, a counter electrode is formed on the organic EL element 12 by an appropriate film formation process such as an evaporation process or a sputter process. The respective outer connection terminals of the transparent electrode and the counter electrode are formed in a margin of the flexible base material 11 while the transparent electrode and the counter electrode are maintained to be isolated from each other. The outer connection terminals are bonded to the FPC 17.

Step of Forming First Sealing Unit

Subsequently, the organic EL element 12 provided on the flexible base material 11 is sealed by the first sealing section 13. First, a resin layer for formation of the first resin sealing layer 21 is provided on one surface of the first sealing substrate 22 to prepare a substrate with a first resin for formation of the first sealing section 13. The substrate with the first resin is laminated to the flexible base material 11 and the organic EL element 12 such that the resin layer side of the substrate with the first resin covers over the flexible base material 11 and the top and the side surface of the organic EL element 12. After the lamination, the resin layer is cured by heating or the like. As a result, the first sealing unit 19 is formed in such a manner that the organic EL element 12 is covered with the first resin sealing layer 21 and sealed by the first sealing section 13 and the flexible base material 11.

Step of Providing Moisture Absorbent Layer

Subsequently, the moisture absorbent layer 16 is formed on the first sealing section of the first sealing unit 19. A layer containing a moisture-absorbing compound is provided as the moisture absorbent layer 16 over the first sealing substrate 22 of the first sealing section 13. For example, the moisture absorbent layer 16 containing a binder resin and the moisture-absorbing compound is formed by applying a composite as a mixture of a resin binder and the moisture-absorbing compound to over the first sealing substrate 22 to a required thickness.

In a configuration where the moisture absorbent layer 16A is provided from the top to the side surface of the first sealing unit 19 as in the organic EL light emitting device 10A of FIG. 2, the composite as the mixture of the resin binder and the moisture-absorbing compound is applied from the top to the side surface of the first sealing unit 19 to a required thickness. Alternatively, a sheet-like moisture absorbent layer 16A is provided from the top to the side surface of the first sealing unit 19. In such a case, an adhesive layer may be formed to laminate the sheet-like moisture absorbent layer 16A.

In a configuration where the moisture absorbent layer 16B is provided from the top and the side surface of the first sealing section 13 to the marginal region 28 of the flexible base material 11B with the adhesive layer 27 in between as in the organic EL light emitting device 10B of FIG. 3, the sheet-like moisture absorbent layer is laminated by the adhesive layer 27 to form the moisture absorbent layer 16B. When the moisture absorbent layer 16B is provided without the adhesive, the composite as the mixture of the resin binder and the moisture-absorbing compound is applied in a region from the top and the side surface of the first sealing section 13 to the marginal region 28 of the flexible base material 11B to a required thickness to form the moisture absorbent layer 16B.

Step of Sealing First Sealing Unit and Moisture Absorbent Layer by Second Sealing Section and Third Sealing Section Subsequently, the first sealing unit 19 and the moisture absorbent layer 16 are sealed by the second sealing section 14 and the third sealing section 15. First, a resin layer for formation of the second resin sealing layer 23 is provided on one surface of the second sealing substrate 24 to prepare a substrate with a second resin for formation of the second sealing section 14. Similarly, a resin layer for formation of the third resin sealing layer 25 is provided on one surface of the third sealing substrate 26 to prepare a substrate with a third resin for formation of the third sealing section 15.

The resin layer of the substrate with the second resin and the resin layer of the substrate with the third resin are oppositely disposed, and the first sealing unit 19 having the moisture absorbent layer 16 is disposed between the substrate with the second resin and the substrate with the third resin. At this time, the first sealing unit 19 is disposed such that marginal portions of the substrate with the second resin and the substrate with the third resin are exposed around the first sealing unit 19. The FPC 17 is led out from the ends of the substrate with the second resin and the substrate with the third resin.

Subsequently, the substrate with the second resin and the substrate with the third resin are crimped to each other so as to hold the first sealing unit 19 having the moisture absorbent layer 16. As a result, the substrate with the second resin is laminated to the moisture absorbent layer 16 and the side surface of the first sealing section 13. In addition, the substrate with the third resin is laminated to the back of the flexible base material 11 and the side surface of the first sealing section 13. Similarly, the substrate with the second resin is laminated to the substrate with the third resin in the peripheral seal part 18.

Furthermore, after the substrate with the second resin is laminated to the substrate with the third resin, each resin layer is cured by heating or the like to form the second resin sealing layer 23 and the third resin sealing layer 25. Consequently, the second sealing section 14 and the third sealing section 15 are formed so as to seal the first sealing unit 19 and the moisture absorbent layer 16.

The organic EL light emitting device 10 can be manufactured through the above-described steps. In such manufacturing of the organic EL light emitting device 10, the steps are preferably performed in one-time vacuuming from formation of the organic EL element 12 through sealing with the second sealing section 14 and the third sealing section 15. The device is optionally extracted from the vacuum atmosphere preferably in a dried inert-gas atmosphere during manufacturing. Each substrate with a resin or the sheet-like moisture absorbent layer may be produced in another step that is not included in the series of steps for manufacturing the organic EL light emitting device 10.

Modification of Organic EL Light Emitting Device

Although the respective embodiments describe a structure where the first sealing unit and the moisture absorbent layer are sealed by the outer sealing section including the second sealing section and the third sealing section, a configuration of the outer sealing section to seal the first sealing unit and the moisture absorbent layer is not limited to such a configuration. For example, in a possible configuration, one peripheral seal part does not exist, and the second resin sealing layer and the second sealing substrate cover from a light-emitting surface side to a back side of a combination of the first sealing unit and the moisture absorbent layer, thereby the first sealing unit and the moisture absorbent layer are entirely sealed only by the second sealing section. In another possible configuration, the second sealing section is directly connected to the marginal portion of the flexible base material, and the organic EL element, the first sealing section, and the moisture absorbent layer are sealed only by the flexible base material and the second sealing section.

The present invention is not limited to the configurations described in the above-described exemplary embodiments, and various modifications and alterations may be made within a scope without departing from the configuration of the invention.

LIST OF REFERENCE SIGNS

10, 10A, 10B . . . Organic EL light emitting device, 11, 11B . . . Flexible base material, 12 . . . Organic EL element, 13 ... First sealing section, 14 ... Second sealing section, 15 ... Third sealing section, 16, 16A, 16B ... Moisture absorbent layer, 17 ... FPC, 18 ••• Peripheral seal part, 19 ... First sealing unit, 21 ... First resin sealing layer, 22 ... First sealing substrate, 23 ... Second resin sealing layer, 24 ... Second sealing substrate, 25 ... Third resin sealing layer, 26 ... Third sealing substrate, 27 ... Adhesive layer, 28 ... Marginal region

The invention claimed is:

1. An organic electroluminescence light emitting device, comprising:
    a flexible base material;
    an organic electroluminescence element provided on the flexible base material;
    a first sealing section sealing the organic electroluminescence element over the flexible base material;
    a moisture absorbent layer provided on the first sealing section; and
    a second sealing section covering the moisture absorbent layer and the first sealing section,
    wherein the organic electroluminescent element comprises electrodes,
    the device further comprises a flexible printed circuit and lead lines,
    the lead lines are located on the flexible base material and connected to the electrodes of the organic electroluminescent element,
    the flexible printed circuit is connected to the lead lines and in contact with the flexible base material and the second sealing section, and
    the flexible printed circuit is extended to an outside of the second sealing section.

2. The organic electroluminescence light emitting device according to claim 1, wherein the first sealing section includes a first resin sealing layer that entirely covers a top and a side surface of the organic electroluminescence element over the flexible base material, and a first sealing substrate bonded to the flexible base material by the first resin sealing layer with the organic electroluminescence element in between.

3. The organic electroluminescence light emitting device according to claim 2, wherein the moisture absorbent layer covers from over the first sealing substrate to a side surface of the first resin sealing layer.

4. The organic electroluminescence light emitting device according to claim 2, wherein the flexible base material comprises a glass or a polymer.

5. The organic electroluminescence light emitting device according to claim 1, further comprising a third sealing section that is bonded to the second sealing section with the flexible base material, the organic electroluminescence element, the first sealing section, and the moisture absorbent layer in between.

6. The organic electroluminescence light emitting device according to claim 5, wherein the third sealing section includes a third resin sealing layer bonded to the second sealing section and the flexible base material, and a third sealing substrate bonded to the second sealing section by the third resin sealing layer.

7. The organic electroluminescence light emitting device according to claim 1, further comprising an adhesive layer that bonds the moisture absorbent layer to the first sealing section.

8. The organic electroluminescence light emitting device according to claim 7, wherein a width of the adhesive layer is equal to a width of the moisture absorbent layer.

9. The organic electroluminescence light emitting device according to claim 1, wherein the moisture absorbent layer covers the first sealing section and the flexible base material.

10. The organic electroluminescence light emitting device according to claim 9, further comprising an adhesive layer that bonds between the moisture absorbent layer and the first sealing section and between the moisture absorbent layer and the flexible base material.

11. The organic electroluminescence light emitting device according to claim 1, wherein the moisture absorbent layer includes a binder resin and a moisture-absorbing compound.

12. The organic electroluminescence light emitting device according to claim 11, wherein the moisture-absorbing compound includes at least one selected from among alkaline earth metal, alkali metal, alkaline earth metal oxide, alkali metal oxide, and inorganic porous material.

13. The organic electroluminescence light emitting device according to claim 1, wherein the flexible printed circuit is further in contact with the first sealing section.

* * * * *